United States Patent [19]

Baca

[11] Patent Number: 4,942,595

[45] Date of Patent: Jul. 17, 1990

[54] CIRCUIT FOR DIVIDING THE FREQUENCY OF A DIGITAL CLOCK SIGNAL BY TWO AND ONE-HALF

[75] Inventor: Anthony J. Baca, Glendale, Ariz.

[73] Assignee: AG Communication Systems Corporation, Phoenix, Ariz.

[21] Appl. No.: 280,060

[22] Filed: Dec. 5, 1988

[51] Int. Cl.[5] .................... H03K 21/02; H03K 21/38; H03K 23/48

[52] U.S. Cl. .................... 377/48; 377/108; 377/107

[58] Field of Search .................... 377/47, 48, 107, 108

[56] References Cited

U.S. PATENT DOCUMENTS

| | | | |
|---|---|---|---|
| 3,614,632 | 10/1971 | Leibowitz et al. | 377/107 |
| 3,896,387 | 7/1975 | Kokado | 377/48 |
| 4,041,403 | 8/1977 | Chiapparoli | 377/48 |
| 4,348,640 | 9/1982 | Clendening | 377/48 |
| 4,390,960 | 6/1983 | Yamashita et al. | 377/48 |
| 4,573,176 | 2/1986 | Yeager | 377/48 |
| 4,646,332 | 2/1987 | Sajor et al. | 377/107 |

Primary Examiner—John S. Heyman
Attorney, Agent, or Firm—Anthony J. Baca

[57] ABSTRACT

A circuit for dividing a clock signal by two and one-half (2.5) is shown. The divide by two and one-half (2.5) circuit includes a clock selector circuit arranged to output a selected polarity of the first clock signal. A ring counter arranged to receive the clock selector circuit output signal, and output a signal that has a period of 3 times (3×) the signal received from the clock selector circuit. A divide by two circuit connected to the ring counter circuit and to the clock selector circuit. The divide by two circuit divides the ring counter output signal by two to produce an output signal. The divide by two output signal is then fed back to the clock selector circuit to regulate the selection of the first clock signal polarity, causing the ring counter to output a clock signal with a period of two and one-half times (2.5×) the first clock signal.

5 Claims, 2 Drawing Sheets

CIRCUIT FOR DIVIDING THE FREQUENCY OF A DIGITAL CLOCK SIGNAL BY TWO AND ONE-HALF

BACKGROUND OF THE INVENTION

The present invention relates in general to digital clock generating systems, and more particularly to a circuit that will accept as an input a periodic signal of frequency F and produce as an output, two periodic signals of frequency 0.4*F (F/2.5) and 0.2*F (F/5).

It is well known to those skilled in the art that synchronous systems are more stable than asynchronous systems. However, one disadvantage to synchronous systems is their requirement for a master clock with multiple clocks derived from this master source. Problems arise when the master clock must be divided by an inconvenient value, such as 2.5.

Prior to the present invention, the divide by 2.5 would have been done with a Phase Locked Loop (PLL). When a PLL is configured for frequency synthesis, it has as a minimum a Voltage Controlled Oscillator (VCO), phase detector, low pass filter, and a divide by N feedback circuit. Depending on such factors as frequency of operation, stability required and cost, several additional components could be added to the basic frequency synthesis PLL.

In generating the divide by 2.5 function, the frequency synthesis PLL requires a VCO with a center frequency of two times that of the original frequency (F). This makes the VCO a very complex and expensive component when trying to perform a divide by 2.5 function on high frequency clocks. Because the VCO is a function of the original frequency (F), the frequency synthesis PLL and VCO must be redesigned for each frequency that is to be divided.

An additional disadvantage with PLLs is their inherent production of jitter and wonder even when properly designed. Under certain conditions the PLL can become unstable and actually produce a frequency other then the desired one.

Accordingly, it is an objective of the present invention to provide a divide by 2.5 circuit which does not require frequent redesign or a need for expensive components.

SUMMARY OF THE INVENTION

In accomplishing the object of the present invention there is provided a divide by two and one-half (2.5) circuit for generating a second clock signal that has a period of two and one-half times (2.5x) a first clock signal. The divide by two and one-half (2.5) circuit includes a clock selector circuit arranged to output a selected polarity of the first clock signal.

The circuit of the present invention further includes, a ring counter arranged to receive the clock selector circuit output signal, and output a signal that has a period of 3 times (3x) the signal received from the clock selector circuit.

The circuit of the present invention includes a divide by two circuit connected to the ring counter circuit and to the clock selector circuit. The divide by two circuit divides the ring counter output signal by two to produce an output signal. The divide by two output signal is then fed back to the clock selector circuit to regulate the selection of the first clock signal polarity, causing the ring counter to output a clock signal with a period of two and one-half times (2.5x) the first signal.

DESCRIPTION OF THE DRAWINGS

A better understanding of the invention may be had from the consideration of the following detailed description taken in conjunction with the accompanying drawings in which.

DESCRIPTION OF THE PREFERRED EMBODIMENT

Figure 1:
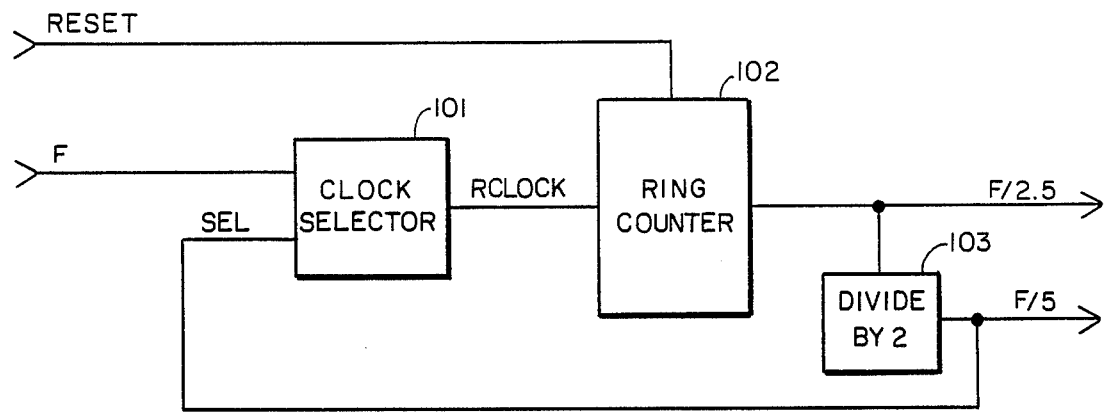
FIG. 1 is a block diagram of the divide by 2.5 circuit in accordance with the present invention.

Turning now to FIG. 1, a general description of the present invention will be given.

The present invention uses a counter 102 which is initially loaded with a seed value. The seed value is then clocked around the ring counter by each rising edge of the Ring CLOCK (RCLOCK). A clock selector 101 under the control of the original clock (F) divided by 5 (F/5), selects which polarity of F is to be passed on as RCLOCK.

By changing the size of the ring counter and/or seed value, other divide functions can be realized with this invention.

When power is first applied to the circuit the ring counter must be loaded with a seed value which, in the present invention, is 011 binary. The rising edge of RCLOCK rotates the seed right by one bit position with the least significant bit wrapping around into the most significant bit position. Therefore, after this first rotation the ring count value is 101 binary. The rising edges of RCLOCK continue to rotate the ring value by one bit position through 110 and back to the starting value of 011 then to 101 and so on.

Outside of the ring, the least significant bit is delayed by one RCLOCK pulse to generate F/2.5. A divide by two circuit 103 is used to convert F/2.5 into F/5.

Clock F/5 helps generate RCLOCK in the following manner. When F/5 is a logic 1 ("hi"), the positive polarity of F is selected. When F/5 is a logic 0 ("low"), the inverse polarity of F is selected. By switching between the two polarities of the original clock, one additional rising edge is added for every six rising edges of the original clock. This allows the ring counter clock to alternate between rising and falling edges of F.

Figure 2:
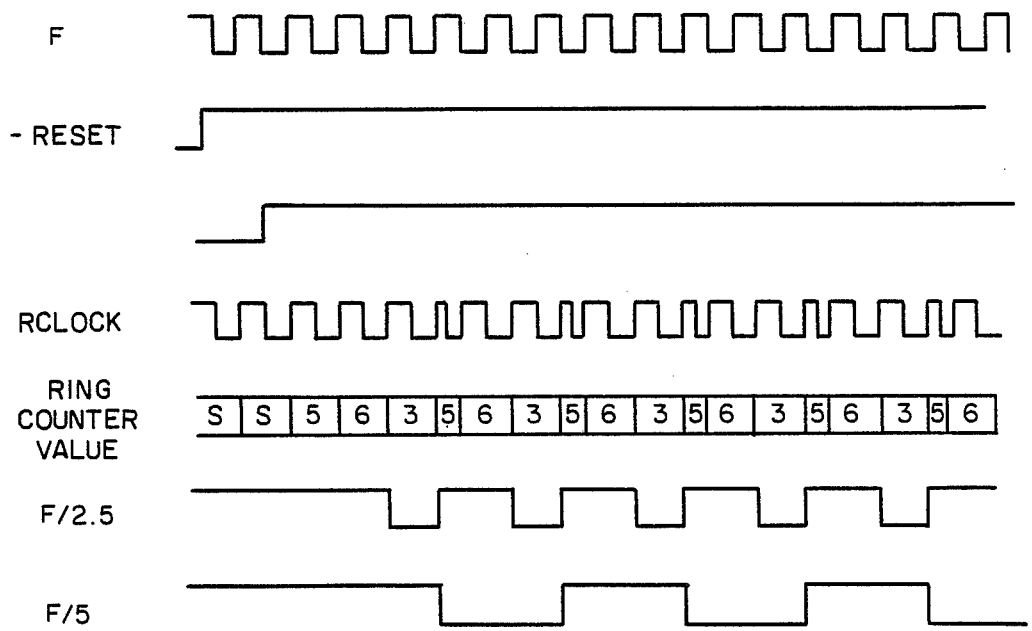
FIG. 2 is a timing diagram showing internal signals of the divide by 2.5 circuit.
Figure 3:
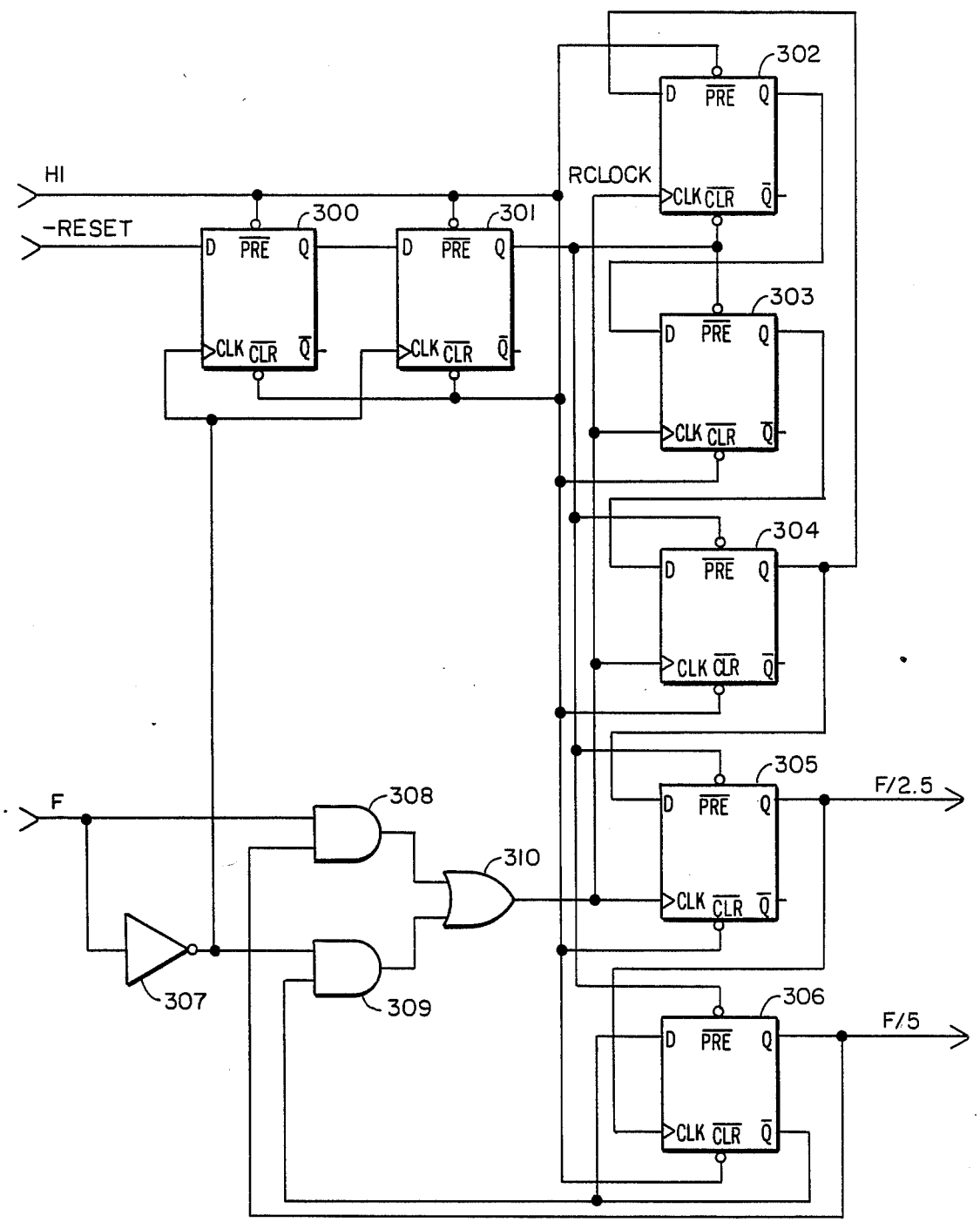
FIG. 3 is a schematic diagram of the divide by 2.5 circuit shown in FIG. 2 in accordance with the present invention.

Turning now to FIG. 2 and FIG. 3, a detailed description of the present invention will be given.

Signal HI is a logic level "1" signal which is used to pull unused gate inputs to the "1" state. Signal -RESET loads the seed after initial power up. Signal F is the original clock signal that is to be divided by 2.5. RCLOCK clocks the ring counter and is derived from F. Ring Counter Value, shows the value of the ring counter at any given time, where "S" equals the seed or 011 binary, "3" equals 011 binary, "5" equals 101 binary and "6" equals 110 binary. Outputs F/2.5 and F/5 have frequencies of 0.4 and 0.2 of the original clock (F) respectively. From FIG. 2 it is clear that signal F/2.5 does not exhibit a 50/50% duty cycle. In actuality it exhibits a 60/40% duty cycle. But it does, however, have a period that is 2.5 times that of the original clock. That is, for every five cycles of F, there are two cycles of F/2.5.

The clock signal to be divided is applied to inverter 307 which generates the complement of F (−F). To insure all setup and hold times are met in the ring counter, −F is used by D−FFs 300 and 301 to double buffer the asynchronous signal, -RESET. Double buffering squelches the effect of D-FF 300's setup and hold times violations in the following manner. When D-FF 300's setup or hold times are violated, buffer 300 can enter a meta-stable state. The second buffer 301 allows the meta-stable output of 300 to stabilize before clocking signal -RESET out to the ring counter.

When -RESET is asserted "low", the output of D-FF 300, will go "low" after the falling edge of F. This in turn causes the output of D-FF 301 to go "low" after another falling edge of F. The "low" output of 301 loads the seed into the ring counter D-FF 302, 303 and 304 and also presets D-FF 305 and 306. The outputs of 306 (F/5 and -F/5) are fed back to AND gates 308 and 309.

Gates 308, 309, and 310 form a multiplexer which, under the control of F/5 and −F/5, selects either F or −F as the output. As stated earlier, when -RESET is "low", F/5 will be "hi", thus F is passed through the multiplexer to become RCLOCK. This insures that the ring counter is clocked on the opposite edge from that of the reset synchronizer.

The output of D−FF 301 will go "hi" on the second falling edge of F, after -RESET has been pulled "hi". The next rising edge of RCLOCK, which is F at this time, will change the ring counter value from value S to value 5, as can be clearly seen at FIG. 2. As the next rising edge of RCLOCK advances the ring count from value 5 to value 6, the rising edge also clocks the previous least significant bit out of D-FF 305. Since the least significant bit of the previous ring value was 1, (or, the ring value was odd) F/2.5 at the output of D-FF 305, will remain "hi".

As the next rising edge of RCLOCK advances the ring count from value 6 to value 3, the rising edge also clocks the previous least significant bit out of D-FF 305. This time the least significant bit of the previous ring value was 0, (or, the ring value was even) so, F/2.5 at the output of D-FF 305, will go "low". It will be appreciated that at this time F/5 has not changed states, therefor RCLOCK is still the positive polarity of F.

The next rising edge of RCLOCK advances the ring count from value 3 to value 5 and clocks the previous least significant bit out of D-FF 305. Since the previous ring value was odd, F/2.5 at the output of D-FF 305, will change from "low" to "hi". The rising edge of F/2.5 causes D-FF 306 to change from "hi" to "low" which changes the RCLOCK selection from F to −F. Care must be taken to insure that the short pulse on RCLOCK during the clock transitions meets the minimum clock pulse requirements of D-FFs 302, 303, 304 and 305.

From FIG. 2 it is clear that F/2.5 is "low" after the ring value was even, and is "hi" after the ring value was odd. Also, F/5 changes state (toggles) on each rising edge of F/2.5. This effectively changes the clock selection from one polarity of F to the complement.

Although the preferred embodiment of the invention has been illustrated, and that form described, it will be readily apparent to those skilled in the art that various modifications may be made therein without departing from the spirit of the invention or from the scope of the appended claims.

What is claimed is:

1. A divide by two and one half (2.5) circuit for receiving a first clock signal and an asynchronous reset signal, said divide by two and one half (2.5) circuit arranged to transmit a second clock signal that has a period two and one half (2.5) times said first clock signal, said divide by two and one half (2.5) circuit comprising:
   clock selector means arranged to receive said first clock signal and to output a selected polarity of said first clock signal;
   ring counter means having a predetermined number of stages arranged to receive said clock selector means output, and to transmit an output signal that has a period of 3 times (3x) the signal received from said clock selector means;
   divide by two means arranged to receive said ring counter means output and to transmit an output signal that has a clock period of two times (2x) said ring counter means output signal, wherein said divide by two means output signal is input to said clock selector means and said ring counter means transmits said second clock signal; and
   reset synchronizer means arranged to initialize said ring counter means to a seed value other than all said stages at logic zero, in response to said asynchronous reset signal.

2. The divide by two and one half (2.5) circuit as claimed in claim 1, wherein: said reset synchronizer comprises a first and second D-FF each with a D input and an output, said first D-FF D input connected to said asynchronous reset signal, said second D-FF D input connected to said first D-FF output, said second D-FF output connected to said ring counter means, said first and second D-FF further including a common clock input connected to said clock selector means.

3. A divide by two and one half (2.5) circuit for receiving a first clock signal and an asynchronous reset signal, said divide by two and one half (2.5) circuit arranged to transmit a second clock signal that has a period two and one half (2.5) times said first clock signal, said divide by two and one half (2.5) circuit comprising:
   inverter means arranged to receive said first clock signal and transmit the complement polarity;
   clock selector means arranged to receive said first clock signal and said inverter means output, said clock selector means outputs a selected polarity of said first clock signal;
   ring counter means having a predetermined number of stages arranged to receive said clock selector means output, and to transmit an output signal that has a period of 3 times (3x) the signal received from said clock selector means;
   divide by two means arranged to receive said ring counter means output and to transmit an output signal that has a clock period of two times (2x) said ring counter means output signal, wherein said divide by two means output signal is input to said clock selector means and said ring counter means transmits said second clock signal; and
   reset synchronizer means arranged to initialize said ring counter means to a seed value other than all said stages at logic zero, in response to said asynchronous reset signal.

4. The divide by two and one half (2.5) circuit as claimed in claim 3, wherein: said reset synchronizer comprises a first and second D-FF each with a D input and an output, said first D-FF D input connected to said asynchronous reset signal, said second D-FF D input connected to said first D-FF output, said second D-FF output connected to said ring counter means, said first and second D-FF further including a common clock input connected to said clock selector means.

5. A divide by two and one half (2.5) circuit for receiving a first clock signal and an asynchronous reset signal, said divide by two and one half (2.5) circuit arranged to transmit a second clock signal that has a period two and one half (2.5) times said first clock signal, said divide by two and one half (2.5) circuit comprising:

clock selector means arranged to receive said first clock signal and to output a selected polarity of said first clock signal;

ring counter means arranged to receive said clock selector means output, and to transmit an output signal that has a period of 3 times (3x) the signal received from said clock selector means;

divide by two means arranged to receive said ring counter means output and to transmit an output signal that has a clock period of two times (2x) said ring counter means output signal, wherein said divide by two means output signal is input to said clock selector means and said ring counter means transmits said second clock signal; and a first and second D-FF each with a D input and an output, said first D-FF D input connected to said asynchronous reset signal, said second F-FF D input connected to said first D-FF output, said second D-FF output connected to said ring counter means, said first and second D-FF further including a common clock input connected to said clock selector means.

* * * * *